US009029692B2

(12) United States Patent
Wang et al.

(10) Patent No.: US 9,029,692 B2
(45) Date of Patent: May 12, 2015

(54) TELLURIUM INORGANIC REACTION SYSTEMS FOR CONDUCTIVE THICK FILM PASTE FOR SOLAR CELL CONTACTS

(71) Applicant: Heraeus Precious Metals North America Conshohocken LLC, West Conshohocken, PA (US)

(72) Inventors: Lei Wang, Conshohocken, PA (US); Matthias Hörteis, Hanau (DE); Weiming Zhang, Blue Bell, PA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 0 days.

(21) Appl. No.: 13/864,369

(22) Filed: Apr. 17, 2013

(65) Prior Publication Data
US 2013/0269773 A1    Oct. 17, 2013

Related U.S. Application Data

(60) Provisional application No. 61/625,383, filed on Apr. 17, 2012, provisional application No. 61/684,884, filed on Aug. 20, 2012.

(51) Int. Cl.
| | |
|---|---|
| *H01L 31/0224* | (2006.01) |
| *H01L 31/0264* | (2006.01) |
| *H01B 1/16* | (2006.01) |
| *C03C 3/12* | (2006.01) |
| *H01B 1/22* | (2006.01) |

(52) U.S. Cl.
CPC .... *H01L 31/022425* (2013.01); *H01L 31/0264* (2013.01); *C03C 3/12* (2013.01); *H01B 1/16* (2013.01); *H01B 1/22* (2013.01)

(58) Field of Classification Search
CPC ............... H01L 31/0264; H01L 31/022425
USPC ................ 136/256, 255, 252; 252/501.1
See application file for complete search history.

(56) References Cited

U.S. PATENT DOCUMENTS

| | | | |
|---|---|---|---|
| 4,945,071 A | | 7/1990 | Friesen et al. |
| 5,136,351 A | * | 8/1992 | Inoue et al. .................... 257/436 |
| 5,282,902 A | * | 2/1994 | Matsuyama ................ 136/249 |
| 5,378,408 A | * | 1/1995 | Carroll et al. ................... 252/514 |
| 5,957,828 A | * | 9/1999 | Hayashi ........................... 516/88 |
| 6,071,437 A | | 6/2000 | Oya |
| 6,086,790 A | * | 7/2000 | Hayashi et al. ............... 252/500 |
| 6,117,366 A | * | 9/2000 | Park et al. ...................... 252/512 |
| 6,136,228 A | * | 10/2000 | Hirai et al. ..................... 252/512 |
| 6,366,333 B1 | * | 4/2002 | Yamamoto et al. ........... 349/113 |
| 6,451,433 B1 | * | 9/2002 | Oka et al. ....................... 428/432 |
| 7,940,447 B2 | * | 5/2011 | Wu et al. ........................ 359/265 |
| 8,497,420 B2 | * | 7/2013 | Carroll et al. ................. 136/256 |
| 8,808,581 B2 | * | 8/2014 | Vernooy et al. ............... 252/512 |
| 8,845,932 B2 | * | 9/2014 | Hang et al. .................... 252/514 |
| 8,852,465 B2 | * | 10/2014 | Nakayama et al. ........ 252/519.3 |
| 2004/0046154 A1 | * | 3/2004 | McVicker et al. ............. 252/512 |
| 2004/0259007 A1 | * | 12/2004 | Takahashi et al. ................ 430/8 |
| 2005/0116203 A1 | * | 6/2005 | Takahashi et al. ............ 252/500 |
| 2006/0073667 A1 | * | 4/2006 | Li et al. .......................... 438/311 |
| 2006/0231801 A1 | * | 10/2006 | Carroll et al. ................. 252/500 |
| 2008/0063874 A1 | * | 3/2008 | Rakow et al. ................. 428/426 |
| 2008/0134936 A1 | * | 6/2008 | Kamikoriyama et al. . 106/31.92 |
| 2009/0053469 A1 | * | 2/2009 | Sato et al. ...................... 428/148 |
| 2009/0250106 A1 | * | 10/2009 | Hayashi et al. ............... 136/256 |
| 2010/0096002 A1 | * | 4/2010 | Hayashi et al. ............... 136/252 |
| 2011/0232746 A1 | | 9/2011 | Carroll et al. |
| 2012/0031484 A1 | | 2/2012 | Matsuno et al. |
| 2013/0099179 A1 | * | 4/2013 | Vanheusden et al. ......... 252/514 |

FOREIGN PATENT DOCUMENTS

| | | |
|---|---|---|
| EP | 1 713 092 A2 | 10/2006 |
| EP | 2 317 561 A2 | 5/2011 |
| EP | 2 323 171 | 5/2011 |
| EP | 2317523 A1 | 5/2011 |
| EP | 2 590 177 A2 | 5/2013 |
| JP | H05 128910 A | 5/1993 |
| JP | 2008 251324 A | 10/2008 |
| JP | 2011 082211 A | 4/2011 |
| WO | 92/00925 A1 | 1/1992 |
| WO | 2011/060341 A1 | 5/2011 |

OTHER PUBLICATIONS

Chowdari, B.V.R et al: "Synthesis and characterization of silver borotellurite glasses", Solid State Ionics, North Holland Pub. Company. vol. 86-88, 1996, pp. 521-526.
Kassab Luciana et al: "Enhanced luminescence of Tb3+/Eu3+ doped tellurium oxide glass containing silver nanostructures", Journal of Applied Physics, American Institute of Physics. New York, US, vol. 105, No. 10, May 20, 2009, pp. 103505-103505.
G El-Damrawi: "Silver ion transporting mechanism in superionic conducting AgI-Ag 2 0-Te0 2 glasses", Journal of Physics: Condensed Matter, vol. 11, No. 33, Aug. 23, 1999, pp. 6385-6394.

* cited by examiner

*Primary Examiner* — Golam Mowla
(74) *Attorney, Agent, or Firm* — Blank Rome LLP

(57) ABSTRACT

This disclosure relates to electroconductive paste formulations useful in solar panel technology. In one aspect, the disclosure relates to an inorganic reaction system for use in electroconductive paste compositions, wherein the inorganic reaction system comprises a lead containing matrix composition and a tellurium containing matrix composition. In another aspect, the disclosure relates to an electroconductive paste composition comprising a conductive metal component, an inorganic reaction system and an organic vehicle. Another aspect of the disclosure relates to a solar cell produced by applying an electroconductive paste composition of the invention to a silicon wafer. Yet another aspect relates to a solar cell module assembled using solar cells produced by applying an electroconductive paste composition to a silicon wafer, wherein the electroconductive paste composition comprises an conductive metal component, an inorganic reaction system and an organic vehicle.

25 Claims, No Drawings

TELLURIUM INORGANIC REACTION SYSTEMS FOR CONDUCTIVE THICK FILM PASTE FOR SOLAR CELL CONTACTS

RELATED APPLICATIONS

This patent application claims the benefit of U.S. Provisional Patent Application No. 61/625,383, filed on Apr. 17, 2012, and U.S. Provisional Application No. 61/684,884 filed Aug. 20, 2012, whose disclosures are hereby incorporated by reference in their entirety into the present disclosure.

FIELD OF THE INVENTION

The invention relates generally to electroconductive paste formulations useful in solar panel technology. In one aspect, the invention relates to an inorganic reaction system for use in electroconductive paste compositions, wherein the inorganic reaction system preferably comprises a lead containing matrix composition and a tellurium containing matrix composition. In another aspect, the invention relates to an electroconductive paste composition comprising a conductive metal component, the inventive inorganic reaction system and an organic vehicle. Another aspect of the invention relates to a solar cell produced by applying the electroconductive paste composition of the invention to a silicon wafer. Yet another aspect relates to a solar cell module assembled using solar cells produced by applying an electroconductive paste composition to a silicon wafer, wherein the electroconductive paste composition comprises an conductive metal component, the inventive inorganic reaction system and an organic vehicle.

BACKGROUND OF THE INVENTION

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs.

When light hits a solar cell, a fraction of the incident light is reflected by the surface and the remainder is transmitted into the solar cell. The transmitted light/photons are absorbed by the solar cell, which is usually made of a semiconducting material, such as silicon. The absorbed photon energy excites electrons from the atoms of the semiconducting material, generating electron-hole pairs. These electron-hole pairs are then separated by p-n junctions and collected by conductive electrodes that are applied on the solar cell surface.

The most common solar cells are those based on silicon, more particularly, a p-n junction made from silicon by applying a dopant diffusion layer onto a silicon substrate, coupled with two electrical contact layers or electrodes. In a p-type semiconductor, doping atoms are added to the semiconductor in order to increase the number of free charge carriers (positive holes). The doping atoms remove weakly bound outer electrons from the semiconductor atoms. The purpose of p-type doping is to create an abundance of holes. In the case of silicon, a trivalent atom is substituted into the crystal lattice. One example of a p-type semiconductor is silicon with a boron or aluminum dopant. Solar cells can also be made from n-type semiconductors. In an n-type semiconductor, the doping atoms provide extra electrons to the host substrate, creating an excess of negative electron charge carriers. Such doping atoms usually have one more valence electron than one type of the host atoms. The most common example is atomic substitution in group IV solids (silicon, germanium, tin) which contain four valence electrons by group V elements (phosphorus, arsenic, antimony) which contain five loosely bound valence electrons. One example of an n-type semiconductor is silicon with a phosphorous dopant.

In order to minimize reflection of the sunlight by the solar cell, an antireflection coating (ARC), such as silicon nitride, silicon oxide, alumina oxide, or titanium oxide, is applied to the n-type or p-type diffusion layer to increase the amount of light absorbed into the solar cell. The ARC is typically non-conductive, and may also passivate the surface of the silicon substrate.

For silicon solar cell metallization processes, a rear contact is typically first applied to the silicon substrate. A typical process involves applying a back side silver paste or silver/aluminum paste to form soldering pads, followed by an aluminum paste applied to the entire back side of the substrate. Second, using an electroconductive paste composition, a metal contact may be screen printed onto the front side antireflection layer (after drying of the back side paste) to serve as a front electrode. This electrical contact layer on the front face or front of the cell, where light enters, is typically present in a grid pattern made of "finger lines" and "bus bars" rather than a complete layer because the metal grid materials are typically not transparent to light. The silicon substrate with printed front side and back side paste is then fired, e.g., at a temperature of approximately 700-975° C. After firing, the front side paste etches through the ARC layer, forms an electrical contact between the grid contacts and the semiconductor, and converts the metal paste to metal electrodes on the light receiving surface of the solar cell. The back side paste is typically fired at the same time as the front side paste, and forms an electrical contact with the backside of the silicon substrate. The resulting metallic electrodes allow electricity to flow to and from solar cells connected in a solar panel. See e.g., A. Luque and S. Hegedus, Eds., *Handbook of Photovoltaic Science and Engineering*, J. Wiley & Sons, $2^{nd}$ Edition, 2011; P. Würfel, *Physiks of Solar Cells*, Wiley VCH, Verlag GmbH & Co. KGaA, Weinheim, $2^{nd}$ Edition, 2009.

To assemble a solar module, multiple solar cells may be connected in series and/or in parallel and the ends of the electrodes of the first cell and the last cell are preferably connected to output wiring. The solar cells are typically encapsulated in a transparent thermal plastic resin, such as silicon rubber or ethylene vinyl acetate. A transparent sheet of glass is placed on the front surface of the encapsulating transparent thermal plastic resin. A back protecting material, for example, a sheet of polyethylene terephthalate coated with a film of polyvinyl fluoride having good mechanical properties and good weather resistance, is placed under the encapsulating thermal plastic resin. These layered materials may be heated in an appropriate vacuum furnace to remove air, and then integrated into one body by heating and pressing. Furthermore, since solar cells are typically left in the open air for a long time, it is desirable to cover the circumference of the solar cell with a frame material consisting of aluminum or the like.

A typical electroconductive paste contains metallic particles, a glass frit and an organic medium. These components are usually selected to take full advantage of the theoretical potential of the resulting solar cell. For example, it is desirable to maximize the contact between the metallic paste and silicon surface, and the metallic particles themselves, so that the charge carriers can flow through the interface and finger lines to the bus bars. The glass particles in the composition etch through the antireflection coating layer upon firing, helping to build contact between the metal and the n+ type silicon.

On the other hand, the glass must not be so aggressive that it shunts the p-n junction after firing. Thus, the goal is to minimize contact resistance while keeping the p-n junction intact so as to achieve improved efficiency. Known compositions have high contact resistance due to the insulating effect of the glass in the interface of the metallic layer and silicon wafer, as well as other disadvantages such as high recombination in the contact area. Further, glass frits are known to have wide melting temperature ranges, making their behavior strongly dependent on the processing parameters.

Accordingly, there is a need for new electroconductive paste compositions with improved properties, such as flexible reactivity and thermal behavior.

SUMMARY OF THE INVENTION

In one aspect, the invention relates to an inorganic reaction system comprising a lead containing matrix composition and a tellurium containing matrix composition.

In another embodiment, the lead containing matrix composition (e.g., lead glass frit) is substantially free (e.g., contains less than about 10 weight %, less than about 5 weight %, less than about 4 weight %, less than about 3 weight %, less than about 2 weight %, less than about 1 weight %, less than about 0.5 weight %, less than about 0.1 weight % or less than about 0.05 weight %) of tellurium oxide.

In another embodiment, the tellurium containing matrix composition (e.g., tellurium glass frit) is substantially free (e.g., contains less than about 10 weight %, less than about 5 weight %, less than about 4 weight %, less than about 3 weight %, less than about 2 weight %, less than about 1 weight %, less than about 0.5 weight %, less than about 0.1 weight % or less than about 0.05 weight %) of lead oxide.

In one embodiment, the lead containing matrix composition is present in the inorganic reaction system in an amount between about 5 and about 95 weight %, preferably between about 10 and about 90 weight %, more preferably between about 15 and about 85 weight %, even more preferably between about 20 and about 85 weight %.

In another embodiment, the lead containing matrix composition is a lead containing glass frit.

In a further embodiment, the lead containing matrix composition comprises lead oxide. In another embodiment, the lead containing matrix composition comprises between about 10 and about 90 weight % lead oxide, preferably between about 20 and about 90 weight % lead oxide, more preferably between about 30 and about 90 weight % lead oxide, even more preferably between about 40 and about 85 weight % lead oxide.

In one embodiment, the tellurium containing matrix composition is present in the inorganic reaction system in an amount between about 0.25 and about 80 weight %, preferably between about 2 and about 70 weight %, more preferably between about 5 and about 70 weight %, even more preferably between about 10 and about 70 weight %.

In another embodiment, the tellurium containing matrix composition is a tellurium containing glass frit.

In a further embodiment, the tellurium containing matrix composition comprises tellurium oxide.

In another embodiment, the tellurium containing matrix composition is at least partially amorphous.

In one embodiment, the tellurium containing matrix composition is amorphous tellurium oxide.

In another embodiment, the tellurium containing matrix composition further comprises at least one oxide of Li, Na, K, Mg, Sr, Ba, Zn, P, B, Si, Ag, Al, Ti, W, V, Cr, Mn, Co, Ni, Cu, Nb, Ta, Th, Ge, Mo, La, Sb, Bi, or Ce.

In another embodiment, the tellurium containing matrix composition is of Formula (I):

$$Te_x[(M^1_{y1}Y^1_{z1})(M^2_{y2}Y^2_{z2})\ldots(M^n_{yn}Y^n_{zn})]O_r \quad \text{(Formula I)}$$

wherein $M^1, M^2 \ldots M^n$ each can be an element selected from Groups 1-16 of the periodic table or is a rare earth element, n is a non-negative integer, e.g., 0, 1, 2, 3 ..., $Y^1, Y^2 \ldots Y^n$ are halogen or chalcogen, and may be the same element or different elements, at least one of x, (y1, y2 ... yn), (z1, z2 ... zn), and r>0, and x/[x+(y1+y2+ ... yn)+(z1+z2+ ... zn)] ratio is from 20% to 100%, preferably 50% to 99%, and more preferably 80% to 95%.

In a further embodiment, M is at least one of Li, Na, K, Mg, Sr, Ba, Zn, P, B, Si, Ag, Al, Ti, W, V, Cr, Mn, Co, Ni, Cu, Nb, Ta, Th, Ge, Mo, La, Sb, Bi, or Ce.

In another embodiment, Y is at least one of O, S, Se, F, Cl, Br, or I.

In one embodiment, the tellurium containing matrix composition has n=0, x=1, z=0, and 2≤r≤3.

In another embodiment, the tellurium containing matrix composition has n=1, wherein the tellurium containing matrix composition is a binary composition comprising Te, $M^1$ and charge-balanced by O and Y.

In a further embodiment, the tellurium containing matrix composition has n=2, wherein the tellurium containing matrix composition is a ternary composition comprising Te, $M^1$, $M^2$ and charge-balanced by O and Y.

In another embodiment, the ratio (weight %) of lead containing matrix composition to tellurium containing matrix composition is from about 10:1 to about 1:10, or about 5:1, about 3:1, about 2:1 and about 1:1.

In another embodiment, the tellurium containing matrix composition is at least one of $(TeO_2)_a(B_2O_3)_b$, $(TeO_2)_a(SiO_2)_b$, $(TeO_2)_a(Li_2O)_b$, $(TeO_2)_a(BaO)_b$, $(TeO_2)_a(ZnO)_b$, $(TeO_2)_a(Al_2O_3)_b$, $(TeO_2)_a(P_2O_5)_b$, $(TeO_2)_a(Na_2O)_b$, $(TeO_2)_a(Al_2O_3)_b(SiO_2)_c$, $(TeO_2)_a(V_2O_5)_b(MoO_3)_c$, $(TeO_2)_a(BaCl_2)_b(P_2O_5)_c$, or $(TeO_2)_a(Ag_2O)_b(ZnO)_c(Na_2O)_d$, wherein 0<a<1, 0<b<1, 0<c<1, and 0<d<1; preferably, 0.25<a<1, 0<b<0.75, 0<c<0.75, and 0<d<0.75.

In another aspect, the invention relates to an electroconductive paste composition comprising a conductive metal component, an inorganic reaction system according to any of the embodiments described herein, and an organic medium.

In one embodiment, the conductive metal component comprises silver, gold, copper, nickel and combinations thereof. In a preferred embodiment, the conductive metal component comprises silver.

In another embodiment, the organic medium comprises a polymer (e.g., ethyl cellulose) and an organic solvent. The organic medium may further comprise a surfactant and/or a thixotropic agent.

In another aspect, the invention relates to a solar cell comprising a silicon wafer and an electroconductive paste composition according to any of the embodiments described herein.

In yet another aspect, the invention relates to a solar cell prepared by a process comprising applying an electroconductive paste composition according to any of the embodiments described herein to a silicon wafer, and firing the silicon wafer.

In a further aspect, the invention relates to a method of producing a solar cell comprising providing a silicon wafer, applying an electroconductive paste composition according to any one the embodiments described herein to the silicon wafer, and firing the silicon wafer.

In another aspect, the invention relates to a solar cell module comprising a plurality of solar cells according to any of the embodiments described herein.

DETAILED DESCRIPTION OF THE INVENTION

The invention relates to electroconductive paste compositions useful, for example, in the manufacture of solar cells. Electroconductive pastes typically contain a conductive metal component, a glass frit and an organic medium. While not limited to such an application, such pastes may be used to form an electrical contact layer or electrode on a solar cell. For example, the paste may be applied to the front side of a solar cell or to the back side of a solar cell and provide the path by which conductivity occurs between cells.

A) The Inorganic Reaction System (IRS)

In one aspect, the invention relates to an inorganic reaction system for use, for example, in an electroconductive paste composition.

The inorganic reaction system of the invention provides a delivery media for the metallic particles, allowing them to migrate from the paste to the interface of the metal conductor and the semiconductor substrate. The inorganic reaction system of the invention also provides a reaction media for the paste components to undergo physical and chemical reactions at the interface. Physical reactions include, but are not limited to, melting, dissolving, diffusing, sintering, precipitating, and crystallizing. Chemical reactions include, but are not limited to, synthesis (forming new chemical bonds) and decomposition, reduction and oxidation, and phase transitioning. The inorganic reaction system of the invention also acts as an adhesion media that provides the bonding between the metal conductor and the semiconductor substrate, thereby securing reliable electrical contact performance during the lifetime of the solar device. Although intended to achieve the same effects, existing glass frit compositions can result in high contact resistance due to the insulating effect of the glass in the interface of the metallic layer and silicon wafer. The inorganic reaction system of the invention acts as a delivery, reaction, and adhesion media, but provides much lower contact resistance and better overall cell performance.

More specifically, the inorganic reaction system of the invention provides improved Ohmic and Schottky contact between the metal conductor (e.g., silver) and the semiconductor emitter (e.g., silicon substrate) in the solar cell. The inorganic reaction system of the invention is a reactive media with respect to the silicon and creates active areas on the silicon emitter that improve overall contact mechanisms, such as through direct contact, or tunneling. The improved contact properties provide better Ohmic contact and Schottky contact, and therefore better overall solar cell performance.

The inorganic reaction system of the invention may comprise crystalline or partially crystalline materials. It may comprise various compounds including, but not limited to, oxides, salts, fluorides, and sulfides, as well as alloys, and elemental materials.

The inorganic reaction system comprises at least one matrix forming composition. The matrix forming composition fuses or sinters at the firing temperature of the inventive inorganic reaction system and/or the electroconductive paste comprising the inorganic reaction system according to the invention. The matrix forming composition may include a glass, ceramic, or any compounds known to one skilled in the art to form a matrix at elevated temperature.

According to the invention, the inorganic reaction system comprises a lead containing matrix composition and a tellurium containing matrix composition.

The Lead Containing Matrix Composition

In one embodiment, the lead containing matrix composition present in the inorganic reaction system is between about 5 to about 95 weight % of the inorganic reaction system, or between about 25 to about 60 weight % of the inorganic reaction system.

In one embodiment, the lead containing matrix composition is a lead containing glass frit. In one embodiment, the lead containing glass frit is substantially amorphous. In another embodiment, the lead containing glass flit incorporates crystalline phases or compounds. In a further embodiment, the lead containing matrix composition may be a mixture of crystalline or amorphous lead oxide or compounds known to one skilled in the art.

In one embodiment, the lead containing matrix composition comprises lead oxide. In certain embodiments, the lead containing matrix composition comprises between about 10 and about 90 weight % lead oxide, such as between about 25 and about 85 weight %, between about 5 and about 45 weight % or between about 10 and about 15 weight %. In one embodiment, the lead containing matrix composition contains about 80 weight % lead oxide.

The lead containing matrix composition may also comprise other oxides or compounds known to one skilled in the art. For example, various lead containing glass compositions, e.g., lead-boron-silicate, lead-alumina-silicate, can be used in the present invention.

In another embodiment, the lead containing matrix composition (e.g., lead containing glass frit) is substantially free (e.g., contains less than about 10 weight %, less than about 5 weight %, less than about 4 weight %, less than about 3 weight %, less than about 2 weight %, less than about 1 weight %, less than about 0.5 weight %, less than about 0.1 weight % or less than about 0.05 weight %) of tellurium oxide.

The Tellurium Containing Matrix Composition

In one embodiment, the tellurium containing matrix composition is present in the inorganic reaction system in an amount between about 0.25 and about 70 weight %, such as between about 0.25 and about 60 weight %, about 5 and about 50 weight % or between about 5 and about 40 weight %.

In one embodiment, the tellurium containing matrix composition is at least partially amorphous. In another embodiment, the tellurium containing matrix composition may be partially crystalline, or substantially crystalline. The tellurium containing matrix composition may be formed by mixing the components, or by forming an amorphous (e.g., glass phase) mixture of the components, or by a combination of these methods.

In one embodiment, the tellurium containing matrix composition is a tellurium containing glass frit. In one embodiment, the tellurium containing glass frit is substantially amorphous. In another embodiment, the tellurium containing glass frit incorporates crystalline phases or compounds.

In one embodiment, the tellurium containing matrix composition comprises amorphous tellurium oxide, e.g., a tellurium oxide glass frit. The tellurium oxide may be $TeO_2$ or $Te_2O_3$, or any tellurium compounds known to one skilled in the art that would produce tellurium oxide at firing temperatures.

In one embodiment, the tellurium containing matrix composition can be expressed according to Formula (I)[1]:

[1] See, e.g., Tellurium Glasses Hand Book: Physical Properties and Data (CRC Press, 2001) and J. Mater. Sci., 18, 1557, 1983.

$$Te_x[(M^1_{y1}Y^1_{z1})(M^2_{y2}Y^2_{z2})\ldots(M^n_{yn}Y^n_{zn})]O_r \quad \text{(Formula I)}$$

wherein $M^1, M^2 \ldots M^n$ each can be an element selected from Groups 1-16 of the periodic table or is a rare earth element;

n is a non-negative integer, e.g., 0, 1, 2, 3 . . .

$Y^1, Y^2 \ldots Y^n$ are halogen or chalcogen, and may be the same element or different elements;

x, (y1, y2 . . . yn), (z1, z2 . . . zn), or r>0; and x/[x+(y1, y2 . . . yn)+(z1, z2 . . . zn)] ratio is from 20% to 100%, and preferably 50% to 99%, and more preferably 80% to 95%.

In another embodiment, the tellurium containing matrix composition, $M^1, M^2, \ldots M^n$ each, independently, is at least one of Li, Na, K, Mg, Sr, Ba, Zn, P, B, Si, Ag, Al, Ti, W, V, Cr, Mn, Co, Ni, Cu, Nb, Ta, Th, Ge, Mo, La, Sb, Bi, or Ce.

In a further embodiment, the tellurium containing matrix composition, $Y^1, Y^2 \ldots Y^n$ each, independently, is at least one of O, S, Se, F, Cl, Br, or I.

Amorphous Tellurium Oxides

The tellurium containing matrix composition may be amorphous tellurium oxide, wherein n=0, x=1, z=0, and 2≤r≤3.

In one embodiment, the tellurium containing matrix composition comprises primarily tellurium oxides, $TeO_2$ or $TeO_3$, or a mixture thereof. The tellurium oxides may be amorphous or crystalline, or a mixture thereof. Amorphous tellurium oxides may be obtained by any suitable means known to one skilled in the art. Typically, tellurium oxides may be melted at temperatures above their melting point, quenched, and milled.

Binary Tellurium Containing Composition

The tellurium containing matrix composition may be a binary composition comprising Te, $M^1$ and charge-balanced by O and Y.

In one embodiment, the tellurium containing matrix composition is a binary composition of Formula (II):

$$Te_x-[M^1_{y1}Y^1_{z1}]-O_r \quad \text{(Formula II)}$$

wherein $M^1$ is an element selected from Groups 1-16 of the periodic table or is a rare earth element;

$Y^1$ is halogen or chalcogen;

x, y1, z1, or r>0; and x/(x+y1+z1) ratio is from 20% to 100%, and preferably 50% to 99%, and more preferably 80% to 95%.

In one embodiment, $M^1$ is selected from Li, Na, K, Mg, Sr, Ba, Zn, P, B, Ag, Al, Ti, W, V, Cr, Mn, Co, Ni, Cu, Nb, Ta, Th, Ge, Mo, La, Sb, Bi, Ce, and combinations thereof.

In a further embodiment, the tellurium containing matrix composition, Y is at least one of O, S, Se, F, Cl, Br, or I.

In one embodiment, $Y^1$ may be O. In another preferred embodiment, x is 0.5 to 1 and y is 0 to 0.5.

Examples of binary tellurium containing matrix compositions include, for example, (Te—B—O), (Te—Si—O), (Te—Li—O), (Te—Ba—O), (Te—Zn—O), (Te—Al—O), (Te—P—O), or (Te—Na—O). The exemplary binary tellurium containing matrix compositions may also be expressed as $(TeO_2)_a(B_2O_3)_b$, $(TeO_2)_a(SiO_2)_b$, $(TeO_2)_a(Li_2O)_b$, $(TeO_2)_a(BaO)_b$, $(TeO_2)_a(ZnO)_b$, $(TeO_2)_a(Al_2O_3)_b$, $(TeO_2)_a(P_2O_5)_b$, or $(TeO_2)_a(Na_2O)_b$, wherein 0<a<1 and 0<b<1; preferably 0.25<a<1 and 0<b<0.75.

Ternary Tellurium Containing Composition

The tellurium containing matrix composition may be a ternary composition comprising Te, $M^1$, $M^2$ and charge-balanced by O and $Y^1$, $Y^2$.

In a further embodiment, the ternary tellurium containing matrix is of Formula (III):

$$Te_x-[(M^1_{y1}Y^1_{z1})(M^2_{y2}Y^2_{z2})]-O_r \quad \text{(Formula III)}$$

wherein $M^1$ and $M^2$ are each, independently, an element (e.g., a metal) selected from Groups 1-16 of the periodic table or a rare earth element;

$Y^1$ and $Y^2$ are halogen or chalcogen, and may be the same element or different elements.

In one embodiment, $M^1$ and $M^2$ are each, independently selected from Li, Na, K, Mg, Sr, Ba, Zn, P, B, Ag, Al, Ti, W, V, Cr, Mn, Co, Ni, Cu, Nb, Ta, Th, Ge, Mo, La, Sb, Bi, or Ce.

In a further embodiment, the tellurium containing matrix composition, $Y^1$ and $Y^2$ are at least one of O, S, Se, F, Cl, Br, or I.

Examples of ternary or multi component tellurium glasses include, for example, (Te—Al—Si—O), (Te—V—Mo—O), or (Te—Ba—Cl—P—O). The exemplary ternary tellurium containing matrix compositions may also be expressed as $(TeO_2)_a(Al_2O_3)_b(SiO_2)_c$, $(TeO_2)_a(V_2O_5)_b(MoO_3)_c$, $(TeO_2)_a(BaCl_2)_b(P_2O_5)_c$, wherein 0<a<1, 0<b<1 and 0<c<1; preferably 0.25<a<1, 0<b<0.75, and 0<c<0.75.

Multi-Component Tellurium Containing Composition

The tellurium containing matrix composition may be a multi-component composition comprises Te, $M^1, M^2 \ldots M^n$ and charge-balanced by O and $Y^1, Y^2 \ldots Y^n$, where n≥3.

$M^1, M^2 \ldots M^n$ are each, independently, an element (e.g., a metal) selected from Groups 1-16 of the periodic table or a rare earth element;

$Y^1, Y^2 \ldots Y^n$ are halogen or chalcogen, and may be the same element or different elements;

In one embodiment, $M^1, M^2 \ldots M^n$ are each, independently selected from Li, Na, K, Mg, Sr, Ba, Zn, P, B, Ag, Al, Ti, W, V, Cr, Mn, Co, Ni, Cu, Nb, Ta, Th, Ge, Mo, La, Sb, Bi, or Ce.

In a further embodiment, the tellurium containing matrix composition, $Y^1, Y^2 \ldots Y^n$ are at least one of O, S, Se, F, Cl, Br, or I.

Examples of ternary or multi component tellurium glasses include, for example, (Te—Ag—Zn—Na—O). The exemplary multi-component tellurium containing matrix compositions may also be expressed as $(TeO_2)_a(Ag_2O)_b(ZnO)_c(Na_2O)_d$, wherein 0<a<1, 0<b<1, 0<c<1, and 0<d<1; preferably 0.25<a<1, 0<b<0.75, 0<c<0.75, and 0<d<0.75.

In another embodiment, the tellurium containing matrix composition may comprise any one of the above disclosed tellurium containing compositions, or a mixture thereof.

In another embodiment, the tellurium containing matrix composition is substantially free (e.g., contains less than about 10 weight %, less than about 5 weight %, less than about 4 weight %, less than about 3 weight %, less than about 2 weight %, less than about 1 weight %, less than about 0.5 weight %, less than about 0.1 weight % or less than about 0.05 weight %) of lead oxide.

In one embodiment, the ratio (weight %) of lead containing matrix composition to tellurium containing matrix composition in the inorganic reaction system is between about 10:1 to about 1:10. Exemplary weight % ratios include about 5:1, about 3:1, about 2:1 and about 1:1.

Using tellurium containing matrix compositions as a part of an inorganic reaction system improves the contact of metallization pastes on silicon emitter surfaces. The silicon emitter structures (such as passivation, surface doping concentration, doping depth profile, etc.) of crystalline silicon solar cells strongly depend on solar cell manufacturers' diffusion recipe and process, as well as the diffusion techniques used (such as the traditional thermal diffusion and ion implantation). The resulting silicon emitter structure can have vastly varying properties. Therefore, depending on the emitter structure, it is desirable to optimize the paste as would be known to one of skill in the art in order to get the best solar cell performance. Tellurium containing matrix compositions have reactivity that can be easily fine tuned. Therefore, incorporation of an inorganic reaction system with a tellurium containing matrix compositions into a paste provides flexible reactivity of silver pastes for different emitters. The thermal behavior of tellurium containing matrix compositions also makes the active component more accessible for other parts of the inorganic reaction system, Ag particles or wafer surface. The controlled reactivity of tellurium containing matrix compositions also balance the reactivity of lead containing matrix compositions in the inorganic reaction system, resulting in a balance between protection of the passivation layer and formation of optimal contact.

Forming the Inorganic Reaction System

The glass frits or matrix forming compositions described herein can be made by any process known to one skilled in the art, by mixing appropriate amounts of powders of the individual ingredients, heating the powder mixture in air or in an oxygen-containing atmosphere to form a melt, quenching the melt, grinding and ball milling the quenched material and screening the milled material to provide a powder with the desired particle size. For example, glass frit components, in powder form, may be mixed together in a V-comb blender. The mixture is then heated (e.g., to around 800-1200° C.) for about 30-40 minutes. The glass is then quenched, taking on a sand-like consistency. This coarse glass powder is then milled, such as in a ball mill or jet mill, until a fine powder results. Typically, the inorganic reaction system may be milled to an average particle sized of about 0.01-10 µm, preferably about 0.1-5 µm.

In another example, conventional solid state synthesis may be used to prepare the inorganic reaction systems described herein. In this case, raw materials are sealed in a fused quartz tube or tantalum or platinum tube under vacuum, and then heated to about 700-1200° C. The materials dwell at this elevated temperature for about 12-48 hours and then are slowly cooled (about 0.1° C./minute) to room temperature. In some cases, solid state reactions may be carried out in an alumina crucible in air.

In another example, co-precipitation may be used to form the inorganic reaction system. In this process, the metal elements are reduced and co-precipitated with other metal oxides or hydroxides to from a solution containing metal cations by adjusting the pH levels or by incorporating reducing agents. The precipitates of these metals, metal oxides or hydroxides are then dried and fired under vacuum at about 400-600° C. to form a fine powder.

The inorganic reaction systems described herein may also comprise additional additives, which can be any oxides or compounds known to one skilled in the art to be useful as additives in electroconductive pastes. For example, fluoride, boron, aluminum, bismuth, lithium, sodium, magnesium, zinc, and phosphate can be used. These exemplary additives may be added to the paste in the form of oxides or salts as known to one skilled in the art, e.g., boric acid, bismuth oxide, sodium oxide, magnesium halide, zinc oxide, and alkaline phosphates.

Other glass matrix formers or glass modifiers, such as germanium oxide, vanadium oxide, tungsten oxide, molybdenum oxides, niobium oxides, tin oxides, indium oxides, other alkaline and alkaline earth metal (e.g., K, Rb, Cs and Ca, Sr, Ba) compounds, rare earth oxides (e.g., $La_2O_3$, cerium oxides), phosphorus oxides or metal phosphates, transition metal oxides (e.g., copper oxides and chromium oxides), metal halides (e.g., lead fluorides and zinc fluorides) may also be used as additives to adjust glass properties such as the glass transition temperature.

B) The Electroconductive Paste Composition

In another aspect, the invention relates to an electroconductive paste composition.

In one embodiment, the electroconductive paste composition comprises a conductive metal component, an inorganic reaction system (according to any of the embodiments described herein), and an organic vehicle.

The Conductive Metal Component

In one embodiment, the conductive metal component comprises, Ag, Au, Cu, Ni and alloys thereof and combinations thereof. In a preferred embodiment, the conductive metal component comprises silver. The silver may be present as silver metal, one or more silver derivatives, or a mixture thereof. Suitable silver derivatives include, for example, silver alloys and/or silver salts, such as silver halides (e.g., silver chloride), silver nitrate, silver acetate, silver trifluoroacetate, silver orthophosphate, and combinations thereof. In one embodiment, the conductive metal component is in the form of particles of a metal or metal derivative.

In one embodiment, the conductive metal component is present in about 50 to about 95 weight % (e.g., from about 65 to about 90 or from about 75 to about 92 weight %) of the solid components of the thick film paste composition.

In one embodiment, the specific surface area of the conductive metal component is about 1.8 $m^2/g$ or greater, such as between about 2 and about 17 $m^2/g$. In another embodiment, the particle size ($D_{50}$) of the conductive metal component is between about 0.05 and about 10 microns, such as between about 0.2 and about 6 microns.

The Organic Medium

In one embodiment, the organic medium comprises an organic solvent and one or more of a binder (e.g., a polymer), a surfactant or a thixotropic agent, or any combination thereof. For example, in one embodiment, the organic medium comprises one or more polymers in an organic solvent.

Suitable polymers include, but are not limited to, cellulose derivatives (e.g., ethyl cellulose, ethyl hydroxyethyl cellulose), rosin derivatives (e.g., wood rosin), phenolic resins, polymethacrylates, polyesters, polycarbonates, polyurethanes, and combinations thereof. In a preferred embodiment the polymer is ethyl cellulose. The polymer may be present in an amount between about 1 and about 10 weight % of the organic medium.

Suitable organic solvents include, but are not limited to, ester alcohols, terpenes (e.g. α- or β-terpineol), kerosene, dibutylphthalate, butyl carbitol, butyl carbitol acetate, hexyl carbitol, hexylene glycol, dimethyladipate, high boiling point alcohols and combinations thereof. In one embodiment, the organic solvent is present in the organic medium in an amount between about 50 and about 70 weight %.

The organic medium may also contain a surfactant and/or a thixotropic agent.

Suitable surfactants include, but are not limited to, polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and combinations thereof. In one embodiment, the surfactant is present in the organic medium in an amount of between about 1 and about 10 weight %.

Suitable thixotropic agents include, but are not limited to, pyrogenic silicas (e.g., Aerosil® 200, Cabosil® PTG), precipitated silicas (e.g., Sylox® TX), modified bentonite clays (e.g., Clatone® PS), hydrogenated castor oil (e.g., Thixin® E), and combinations thereof. In one embodiment, the thixotropic agent is present in the organic medium in an amount of between about 0.1 to about 5 weight %.

In one embodiment, the organic medium is present in the thick film paste composition in an amount between about 1 and about 25 weight %, such as between about 1 and about 20 weight %, or between about 5 and about 15 weight %, based on the total weight of the solid components in the thick film paste composition.

Forming the Electroconductive Paste Composition

To form the electroconductive paste composition, the inorganic reaction system materials may be combined with the conductive metal component (e.g., silver) and the organic medium using any method known in the art for preparing a paste composition. The method of preparation is not critical, as long as it results in a homogenously dispersed paste. The components can be mixed, such as with a mixer, then passed through a three roll mill, for example, to make a dispersed uniform paste. In addition to mixing all of the components simultaneously, the inorganic reaction system material can be co-milled with the conductive metallic component in a ball mill for 2-24 hours to achieve a homogenous mixture of the inorganic reaction system and conductive metallic component particles, which may then combined with the organic medium in a mixer.

C) Solar Cells

In another aspect, the invention relates to a solar cell. In one embodiment, the solar cell comprises a semiconductor substrate (e.g., a silicon wafer) and an electroconductive paste composition according to any of the embodiments described herein.

In another aspect, the invention relates to a solar cell prepared by a process comprising applying an electroconductive paste composition according to any of the embodiments described herein to a semiconductor substrate (such as a silicon wafer) and firing the semiconductor substrate.

In one embodiment, the semiconductor substrate (such as a silicon wafer) may exhibit a sheet resistance above about $60\Omega/\square$, such as above about $65\Omega/\square$, above about $70\Omega/\square$, above about $90\Omega/\square$ or above about $95\Omega/\square$.

In one embodiment, the solar cell may be prepared by applying an electroconductive paste composition to an antireflective coating (ARC), such as silicon nitride, silicon oxide, titanium oxide or aluminum oxide, on a semiconductor substrate, such as a silicon wafer (e.g., by a screen printing process), then firing the semiconductor substrate to form an electrode on the substrate.

In one embodiment, the electroconductive paste composition is applied to the light receiving surface of the semiconductor substrate (e.g., silicon wafer). Typically, the electroconductive paste composition is screen printed over the antireflective coating of a silicon wafer. However, other application methods as known in the art, such as stenciling, may also be used to apply the electroconductive paste composition. However, the foregoing does not preclude incorporating an inorganic reaction system in an electroconductive paste composition intended for the backside of a silicon wafer.

The firing step is typically carried out in air or in an oxygen-containing atmosphere. The firing temperature profile is typically set so as to enable the burnout of organic binder materials from the electroconductive paste composition, as well as any other organic materials present in the paste. Firing is typically carried out in a belt furnace with the substrate (such as a silicon wafer) reaching a peak temperature in the range of about 700 to 900° C. for a period of about 1 to 5 seconds. The firing can be conducted at high transport rates, for example, about 100-500 cm/min, with resulting hold-up times of about 0.05 to 5 minutes. Multiple temperature zones, for example 3-11 zones, can be used to control the desired thermal profile. The front electrode and the back electrodes can be fired sequentially or simultaneously.

In another aspect, the invention relates to a solar cell module comprising a plurality of solar cells according to any of the embodiments described herein. In one embodiment, the plurality of solar cells are electrically interconnected.

EXAMPLES

The following examples illustrate the invention without limitation. All parts are given by weight percent unless otherwise indicated.

Example 1

Five exemplary electroconductive pastes (Pastes 1-5) were prepared using an inorganic reaction system (IRS) that contained a lead-boron-silicate glass frit comprising about 80 weight % lead oxide (Glass A) and one of three tellurium containing glass frits (Glasses B, C or D).

Table 1 shows the composition of the tellurium containing glass frits. Glass B is a binary composition comprising tellurium and boron oxides; Glass C is a binary composition comprising tellurium and silicon oxides; and Glass D is an amorphous tellurium oxide composition.

TABLE 1

Composition of Tellurium Glass Frits B, C and D

| Component | Glass B | Glass C | Glass D |
|---|---|---|---|
|  |  | Weight % |  |
| $TeO_2$ | 93 | 96 | 100 |
| $B_2O_3$ | 7 |  |  |
| $SiO_2$ |  | 4 |  |

Table 2 shows the composition of the IRS in each of exemplary Pastes 1-5. All paste formulations were the same except for the composition of the IRS.

TABLE 2

Composition of IRS Formulations of Exemplary Paste 1-5

| IRS Formulation | Weight % in the Paste | | | | |
|---|---|---|---|---|---|
|  | Paste 1 | Paste 2 | Paste 3 | Paste 4 | Paste 5 |
| Glass A | 2.79 | 2.79 | 2.77 | 2.47 | 2.79 |
| Glass B | 0.9 |  | 0.93 | 1.23 |  |
| Glass C |  |  |  |  | 0.9 |
| Glass D |  | 0.9 |  |  |  |

Silver particles, in an amount of about 85 weight % (of paste), and an organic medium, in an amount of about 1-10 weight % (of paste) were added to form the exemplary pastes. Additional additives as described previously were also incorporated in the paste formulation. Exemplary solar cells were prepared using lightly-doped p-type silicon wafers with a sheet resistance of $95\Omega/\square$ (Wafer Type 1, Monocrystalline), $95\Omega/\square$ (Wafer Type 2, Monocrystalline), $95\Omega/\square$ (Wafer Type 3, Polycrystalline), 125Ω/□ (Wafer Type 4, Polycrystalline), and 90Ω/□ (Wafer Type 5, Monocrystalline).

Solar cells were prepared by screen printing the paste onto the front side of silicon wafers at a speed of 150 mm/s, using a 325 (mesh)*0.9 (mil, wire diameter)*0.6 (mil, emulsion thickness)*70 μm (finger line opening) calendar screen. An aluminum back-side paste was also applied to the back-side of the silicon wafer. The printed wafer was dried at 150° C. and then fired at a peak temperature of about 750-900° C. for a few seconds in a linear multi-zone infrared furnace.

All solar cells were then tested using an I-V tester. A Xe arc lamp in the I-V tester was used to simulate sunlight with a known intensity and the front surface of the solar cell was irradiated to generate the I-V curve. Using this curve, various parameters common to this measurement method (which provide for electrical performance comparison) were determined, including solar cell efficiency (Eta %), series resistance under three standard lighting intensities (Rs3 mΩ) and fill factor (FF %). Direct measurement of contact resistance by four-probe technique was used, but the measurement accuracy is dependent on sample preparation. Therefore, in the circumstance when the finger line resistivity (usually the same silver material and firing condition) and finger line geometry (printing related) are identical, series resistance Rs3 given by H.A.L.M IV tester can be used to evaluate the electrical contact behavior of the conductive paste to silicon substrate. Generally, the smaller the Rs3, the better the contact behavior of the silver pastes.

Pastes 1-5 produced solar cells with overall improved serial resistance, which is evidence that the resulting electrodes were making good contact to the silicon wafer. The improvement in serial resistance can also contribute to overall solar cell performance.

Example 2

Ten additional exemplary electroconductive pastes (Pastes 6-15) were prepared using an inorganic reaction system (IRS) that contained the same leaded glass frit as in Example 1 (Glass A) and at least one of ten tellurium containing glass frits (Glasses E-N). Table 3 shows the composition of the tellurium containing glass frits. Table 4 shows the composition of each of exemplary Pastes 6-15. Electroconductive pastes were formulated similarly to Example 1.

TABLE 3

Composition of Tellurium Glass Frits E-N

| Components | Glass E | Glass F | Glass G | Glass H | Glass I | Glass J | Glass K | Glass L | Glass M | Glass N |
|---|---|---|---|---|---|---|---|---|---|---|
| $TeO_2$ | 80% | 40% | 55% | 96% | 86% | 85% | 93% | 93% | 93% | 96% |
| $Ag_2O$ | 5% | 60% | 45% | | | | | | | |
| $Li_2O$ | | | | 4% | | | | | | |
| BaO | | | | | 14% | | | | | |
| ZnO | 15% | | | | | 15% | | | | |
| $Al_2O_3$ | | | | | | | 7% | | | |
| $P_2O_5$ | | | | | | | | 7% | | |
| $B_2O_3$ | | | | | | | | | 7% | |
| $SiO_2$ | | | | | | | | | | 4% |

TABLE 4

Composition of IRS Formulations of Exemplary Paste 6-15

| | weight % in the Paste | | | | | | | | | |
|---|---|---|---|---|---|---|---|---|---|---|
| IRS Formulation | Paste 6 | Paste 7 | Paste 8 | Paste 9 | Paste 10 | Paste 11 | Paste 12 | Paste 13 | Paste 14 | Paste 15 |
| Leaded Glass A | 2.79 | 2.79 | 2.79 | 2.00 | 2.79 | 2.79 | 2.79 | 2.79 | 2.79 | 2.79 |
| Glass E | 0.9 | | | 0.7 | | | | | | |
| Glass F | | 2.21 | | | | | | | | |
| Glass G | | | 1.65 | | | | | | | |
| Glass H | | | | | 0.9 | | | | | |
| Glass I | | | | | | 0.9 | | | | |
| Glass J | | | | | | | 0.9 | | | |
| Glass K | | | | | | | | 0.9 | | |
| Glass L | | | | | | | | | 0.9 | |
| Glass M | | | | | | | | | | 0.9 |

Solar cells were prepared with exemplary Paste 6-15 as described in Example 1. The resulting solar cells were tested according to the procedures of Example 1. Pastes 6-15 produced solar cells with overall improved serial resistance.

These and other advantages of the invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

What is claimed is:

1. An inorganic reaction system comprising a lead containing matrix composition and a discrete tellurium containing matrix composition, wherein the lead containing matrix composition is present in the inorganic reaction system in an amount between about 5 and about 95 weight %, and the tellurium containing matrix composition is present in the inorganic reaction system in an amount between about 0.25 and about 70 weight %, and wherein the tellurium containing matrix composition is incorporated directly into the inorganic reaction system and is not part of the lead containing matrix composition, and wherein the lead containing matrix composition is discrete from the tellurium containing matrix composition.

2. The inorganic reaction system according to claim 1, wherein the lead containing matrix composition is a lead containing glass frit.

3. The inorganic reaction system according to claim 1, wherein the lead containing matrix composition comprises between about 10 and about 90 weight % lead oxide.

4. The inorganic reaction system according to claim 1, wherein the tellurium containing matrix composition is a tellurium containing glass frit.

5. The inorganic reaction system according to claim 1, wherein the tellurium containing matrix composition comprises tellurium oxide.

6. The inorganic reaction system according to claim 1, wherein the tellurium containing matrix composition is at least partially amorphous.

7. The inorganic reaction system according to claim 1, wherein the tellurium containing matrix composition is amorphous tellurium oxide.

8. The inorganic reaction system according to claim 1, wherein the tellurium containing matrix composition further comprises at least one oxide of Li, Na, K, Mg, Sr, Ba, Zn, P, B, Si, Ag, Al, Ti, W, V, Cr, Mn, Co, Ni, Cu, Nb, Ta, Th, Ge, Mo, La, Sb, Bi, or Ce.

9. The inorganic reaction system according to claim 1, wherein the tellurium containing matrix composition is of Formula (I):

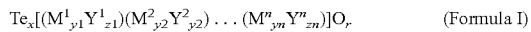   (Formula I)

wherein, $M^1$, $M^2$ ... $M^n$ each can be an element selected from Groups 1-16 of the periodic table or is a rare earth element, n is a non-negative integer, e.g., 0, 1, 2, 3 ..., $Y^1$, $Y^2$ ... $Y^n$ are halogen or chalcogen, and may be the same element or different elements, x, (y1, y2 ... yn), (z1, z2 ... zn), or r>0, and x/[x+(y1, y2 ... yn)+(z1, z2 ... zn)] ratio is from 20% to 100%.

10. The inorganic reaction system according to claim 9, wherein M is at least one of Li, Na, K, Mg, Sr, Ba, Zn, P, B, Si, Ag, Al, Ti, W, V, Cr, Mn, Co, Ni, Cu, Nb, Ta, Th, Ge, Mn, La, Sb, Bi, or Ce.

11. The inorganic reaction system according to claim 9, wherein $Y^1$, $Y^2$ $Y^n$ is at least one of O, S, Se, F, Cl, Br, or I.

12. The inorganic reaction system according to claim 9, wherein the tellurium containing matrix composition has n=0, x=1, z=0, and 2≤r≤3.

13. The inorganic reaction system according to claim 9, wherein the tellurium containing matrix composition has n=1 and the tellurium containing matrix composition is a binary composition comprising Te, $M^1$ and charge-balanced by O and Y.

14. The inorganic reaction system according to claim 9, wherein the tellurium containing matrix composition has n=2 and the tellurium containing matrix composition is a ternary composition comprising Te, $M^1$, $M^2$, and charge-balanced by O and Y.

15. The inorganic reaction system according to claim 1, wherein the lead containing matrix composition is substantially free of tellurium oxide.

16. The inorganic reaction system according to claim 1, wherein the tellurium containing matrix composition is substantially free of lead oxide.

17. The inorganic reaction system according to claim 1, wherein the ratio (weight %) of lead containing matrix composition to tellurium containing matrix composition is from about 10:1 to about 1:10.

18. The inorganic reaction system according to claim 1, wherein the tellurium containing matrix composition is at least one of $(TeO_2)_a(B_2O_3)_b$, $(TeO_2)_a(SiO_2)_b$, $(TeO_2)_a(Li_2O)_b$, $(TeO_2)_a(BaO)_b$, $(TeO_2)_a(ZnO)_b$, $(TeO_2)_a(Al_2O_3)_b$, $(TeO_2)_a(P_2O_5)_b$, $(TeO_2)_a(Na_2O)_b$, $(TeO_2)_a(Al_2O_3)_b(SiO_2)_c$, $(TeO_2)_a(V_2O_5)_b(MoO_3)_c$, $(TeO_2)_a(BaCl_2)_b(P_2O_5)_c$, or $(TeO_2)_a(Ag_2O)_b(ZnO)_c(Na_2O)_d$, wherein 0<a<1.0<b<1, 0<c<1, and 0<d<1.

19. An electroconductive paste composition comprising:
(a) a conductive metal component;
(b) an inorganic reaction system according to claim 1; and
(c) an organic medium.

20. The electroconductive paste composition according to claim 19, wherein the conductive metal component comprises silver, gold, copper, nickel or combinations thereof.

21. The electroconductive paste composition according to claim 19, wherein the conductive metal component comprises silver.

22. The electroconductive paste composition according to claim 19, wherein the conductive metal component is about 50-95 weight % of solid content of the paste.

23. A solar cell comprising a silicon wafer and surface electrode formed with an electroconductive paste composition according to claim 19.

24. The inorganic reaction system according to claim 9, wherein the ratio x/[x+(y1, y2 ... yn)+(z1, z2 ... zn)] is 50% to 99%.

25. The inorganic reaction system according to claim 18, wherein 0.25<a<1, 0<b<0.75, 0<c<0.75, and 0<d<0.75.

* * * * *